United States Patent [19]
Herdt et al.

[11] Patent Number: 6,026,018
[45] Date of Patent: Feb. 15, 2000

[54] NON-VOLATILE, STATIC RANDOM ACCESS MEMORY WITH STORE DISTURB IMMUNITY

[75] Inventors: Christian E. Herdt, Monument; Daryl G. Dietrich, Woodland Park; John R. Gill, Colorado Springs; Paul F. Ruths, Woodland Park, all of Colo.

[73] Assignee: Simtek Corporation, Colorado Springs, Colo.

[21] Appl. No.: 09/137,914

[22] Filed: Aug. 20, 1998

[51] Int. Cl.[7] ................................................. G11C 11/34
[52] U.S. Cl. ............................ 365/185.07; 365/185.02; 365/185.01
[58] Field of Search ................................. 365/226, 227, 365/185.01, 185.07, 185.02

[56]  References Cited

U.S. PATENT DOCUMENTS

| | | | |
|---|---|---|---|
| 4,510,584 | 4/1985 | Dias et al. | 365/203 |
| 5,065,362 | 11/1991 | Herdt et al. | 365/226 |
| 5,563,839 | 10/1996 | Herdt et al. | 365/227 |
| 5,602,776 | 2/1997 | Herdt et al. | 365/185.08 |
| 5,799,200 | 8/1998 | Brant et al. | 395/750.08 |
| 5,828,599 | 10/1998 | Herdt | 365/185.08 |
| 5,847,577 | 12/1998 | Trimberger | 326/38 |

*Primary Examiner*—Viet Q. Nguyen
*Attorney, Agent, or Firm*—Holme Roberts & Owen LLP

[57]  ABSTRACT

The invention relates to a non-volatile, static random access memory (nvSRAM) device that addresses the consequence of a manufacturing defect that occasionally occurs during mass production of the nvSRAM device and if not addressed, reduces the yield of the production process. The consequence of the defect is termed a store disturb because the execution of a store operation in a defective nvSRAM causes the bit of data retained in the SRAM portion and, in some cases, the nv portion of the nvSRAM to be instable or corrupted. The present invention provides an nvSRAM device in which the controller provides modified signals to the nvSRAM memory portion of the device that address the store disturb phenomena and, as a consequence, improve the yield of the manufacturing process.

20 Claims, 7 Drawing Sheets

NON-VOLATILE, STATIC RANDOM ACCESS MEMORY WITH STORE DISTURB IMMUNITY

FIELD OF THE INVENTION

The present invention relates to a non-volatile, static random access memory (nvSRAM), which is also known as a shadow RAM.

BACKGROUND OF THE INVENTION

In general, a computer system is comprised of a memory for holding data and programs, a processor for executing the programs or operating on the data held in memory, and an input/output device for facilitating communications between the computer system and a user. There are several different types of digital memories available for use in the memory portion of a computer system. In many instances, the particular application in which the computer system is intended to be used dictates the type of memory that is appropriate for all or a portion of the memory of the computer system. For instance, one application for a computer system in which an nvSRAM may be appropriate is in a portable computer system. Portable computer systems are generally designed to operate, if needed, with power supplied by a battery housed within the system. If the battery becomes incapable of providing power to the system and an alternative source of power is not available, the data held in memory could become irretrievably lost. In such applications, it is desirable to use an nvSRAM because the static random access memory (SRAM) portion is capable of retaining the data while power is present and providing the performance needed during normal operations, and the non-volatile memory (nv) portion is capable of retaining data for an extended period of time after power has been removed and once power is restored, reestablishing the data in the SRAM portion.

A basic nvSRAM memory device is comprised of (1) a plurality of nvSRAM memory cells; and (2) a controller for managing the operations of the nvSRAM memory cells. The nvSRAM cell is comprised of a static random access memory cell and a non-volatile memory cell. Briefly, the terms "random access memory" and "RAM" refer to the ability to access any one of a plurality of cells in the memory at any time to write/read data to/from the accessed cell. In contrast, other types of memory require that other memory locations be traversed before the desired memory location can be accessed. These types of memories (magnetic tape, for example) are typically much slower than a random access memories. The term "static" refers to the ability of the memory to retain data as long as power is being supplied. In contrast, the term "dynamic" refers to memories that retain data as long as power is being supplied and the memory is periodically refreshed. The term non-volatile refers to the ability of a memory cell to retain data in the absence of power.

The SRAM memory cell in an nvSRAM cell is capable of communicating a bit of data to and from an exterior environment. Additionally, the SRAM memory cell can provide the nv memory cell with a copy of the bit of data, thereby providing backup storage to the SRAM cell in the event power is removed from the nvSRAM cell. The SRAM cell, as long as power is being provided, is capable of: (1) receiving a bit of data from an exterior environment; (2) retaining the bit of data; and (3) transmitting the bit of data back to the exterior environment. If, however, power is removed from the SRAM memory cell, the SRAM memory cell will lose the bit of data. The nv cell prevents this by loss by providing a backup to the SRAM memory cell. In backing up the SRAM memory cell, the nv memory cell provides the ability to: (1) receive a copy of the bit of data stored in the SRAM memory cell; (2) retain the bit of data in the absence of power being provided to the nvSRAM memory cell; and (3) return the bit of data to the SRAM cell when power is present. The copying of a bit of data from the SRAM memory cell into the nv memory cell is referred to as a store operation. The store operation has two phases, an erase phase and a program phase. In the erase phase, the nv memory cell is conditioned so that it can accept a copy of the bit of data presently retained in the SRAM memory cell. The program phase involves copying the bit of data in the SRAM memory cell to the nv memory cell. Returning a previously copied bit of data from the nv memory cell to the SRANI memory cell is referred to as a recall operation.

SUMMARY OF THE INVENTION

During manufacturing of nvSRAM devices, it has been observed that a certain percentage of the nvSRAMs have a defect that corrupts or renders unstable the bit of data stored in the SRAM memory cell and sometimes the nv memory during store operations. The phenomena has been referred to as a store disturb because the store operation disturbs the data retained in the device. An nvSRAM that exhibits the store disturb phenomena are not acceptable and, as a consequence, reduce the yield of acceptable nvSRAMs realized in the manufacturing process.

Analysis of the store disturb phenomena has revealed that a store disturb can occur during both the erase phase and the program phase of a store operation. With respect to the store disturb that can occur during the erase phase, it was discovered that a manufacturing defect resulted in a gated diode breakdown. In the case of a program phase store disturb, it was discovered that a different manufacturing defect resulted in an undesirable sensitivity to the coupling between a defective SRAM memory cell and the nv memory cell. In this case, the defects in the SRAM memory cell are crystal defects and/or excessive pull-up impedance.

To address the store disturb problem and improve the yield of the manufacturing process, it was found that altering the signals issued by the controller to the nvSRAM memory cell during the store operation inhibits the store disturb phenomena from occurring in a number of cases, thereby improving the yield. Three of the control signals that are used in inhibiting store disturbs are identified as Vstr, Vse and Vrcl. During a store operation or recall operation, the Vstr and Vrcl signals are either at one of two different voltages or transitioning therebetween. In one embodiment, the first voltage is 0 volts and the second voltage is +5 volts. In contrast, the Vse signal is at either of three different voltage or transitioning therebetween. In one embodiment, the three different voltages are 0 volts, +12 volts and −12 volts.

To address the store disturb problem that can occur during the erase phase, the Vstr signal is controlled in a different manner than was previously done. For convenience, the prior operation of the control signals is described using the actual voltages noted above with the understanding that different types of nvSRAMs may use different voltages and have different polarities. Previously, during one portion of the erase phase, Vse was set to −12 volts and Vstr was set to 0 volts. Subsequently, Vse was transitioned from −12 volts to 0 volts, and Vstr was substantially simultaneously transitioned from 0 volts to +5 volts. It has been found that erase phase store disturbs are inhibited by delaying the transitioning of Vstr until Vse is outside of the range at which the gated diode breakdown occurs. In one embodiment, the controller holds Vstr at 0 volts for substantially the entire erase phase.

A number of different ways have been discovered for addressing the store disturb problem that can occur during the program portion of the store operation. Each of these ways again involves altering the manner in which the control signals function from what has previously been done. Again, the prior operation of the control signals is described using the actual voltages noted hereinabove. Previously, during the program phase, the Vrcl was set to 0 volts, Vse cycled between 0 volts and +12 volts, and Vstr was set to +5 volts. One way to prevent the coupling that produces the store disturb observed during the program phase, is to cycle Vstr between 0 volts and +5 volts during the program phase. In one embodiment, the transition of Vstr from +5 volts to 0 volts occurs before the transition of Vse from +12 volts to 0 volts. In a further embodiment, this transition of Vstr from 5 volts to 0 volts is substantially complete before the transition of the Vse from +12 volts to 0 volts commences.

Another way to address the coupling that produces a store disturb during the program phase of a store operation is to cycle Vrcl between 0 volts and +5 volts during the program phase. In one embodiment, Vrcl is cycled such that Vrcl is at 0 volts when Vse is at +12 volts and Vrcl is at +5 volts when Vse is at 0 volts. By cycling Vrcl the bit of data stored in the SRAM is refreshed or reestablished.

Yet a further way to address the store disturb problem associated with the program portion of the store cycle is to perform a recall operation immediately after the program portion of the store operation is completed, i.e. before any other operations take place with respect to the SRAM. In this case, a store disturb may have occurred that has rendered the data in the SRAM accurate but unstable. The recall operation serves to refresh or reestablish data in the SRAM that has become unstable.

A further way to address the store disturb phenomena that can occur during the program portion is to reduce the number of cycles of Vse. Presently, Vse is cycled between ground and +12 volts eight times during the program phase. In one embodiment, Vse is cycled only once during the program portion of the store operation.

In many instances, it is desirable to implement a solution for store disturbs that can occur in both the erase and program phases of a store operation. In this case, the controller portion of the nvSRAM device implements the method for addressing erase phase store disturbs and one or a combination of the methods for addressing program phase store disturbs. Whether one or a combination of the methods for addressing program phase store disturbs is implemented is a function of the types of defects that are found to be producing the program phase store disturbs and the available resources. Alternatively, in certain situations, it is feasible that the store disturbs associated with a particular production line can be isolated to either the erase phase or the program phase. If isolated to the erase phase, then it is only necessary to configure the controller to implement the method for inhibiting store disturbs during the erase phase. Likewise, if the store disturbs can be isolated to the program phase, then the controller is configured to implement one or a combination of the methods for addressing program phase store disturbs.

DETAILED DESCRIPTION

Figure 1:
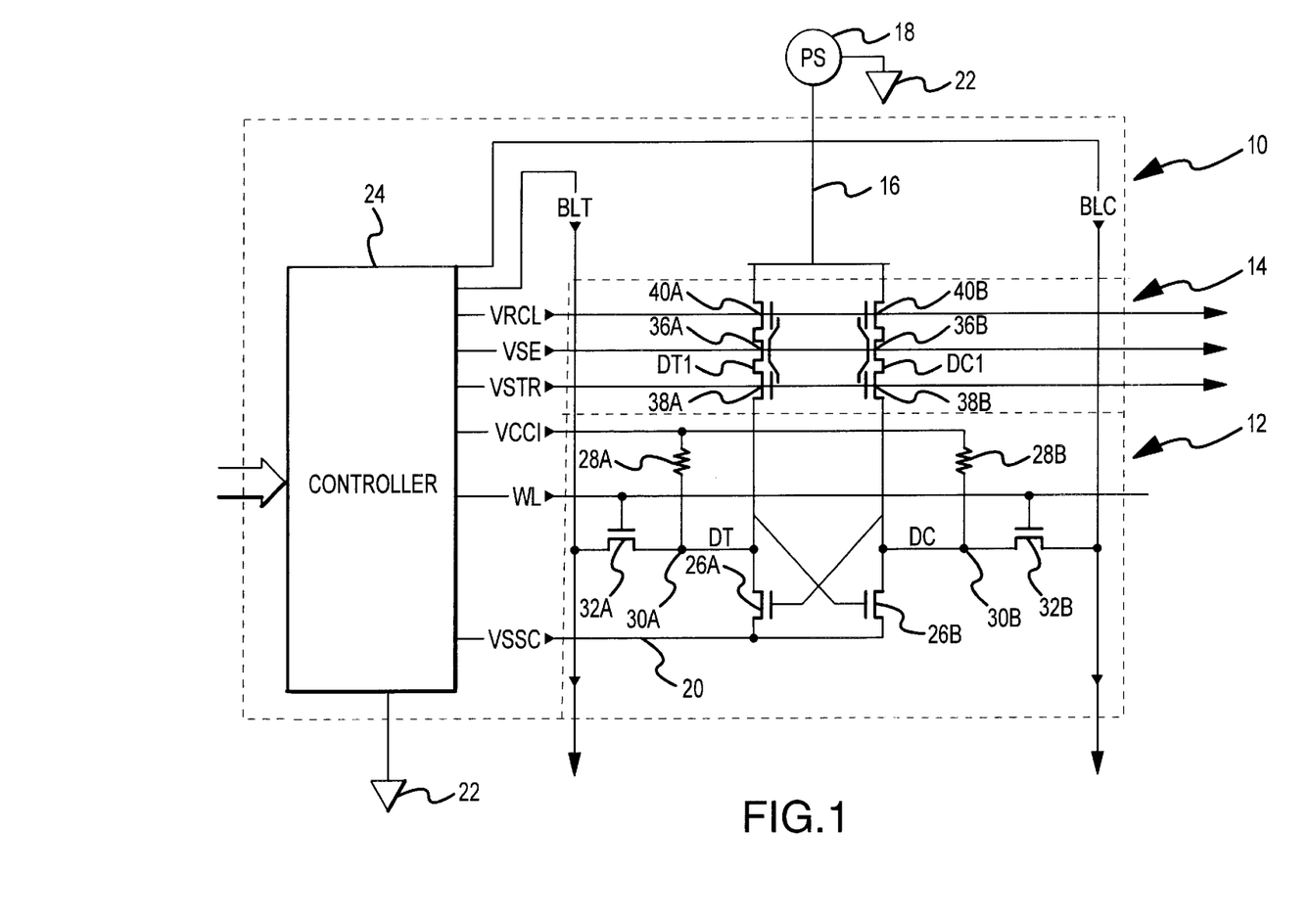
FIG. 1 illustrates an nvSRAM device that includes a memory cell comprised of a static random access memory (SRAM) cell and a non-volatile memory (nv) cell, and a controller for managing the transfer of a bit of data between the SRAM cell and the nv cell.

FIG. 1 illustrates an nvSRAM device with store disturb immunity 10, hereinafter nvSRAM device 10. While the nvSRAM device 10 is illustrated as having a single memory cell to simplify the discussion of the invention, it should be appreciated that an nvSRAM device typically includes a plurality of nvSRAM cells that are integrated with a controller onto a semiconductor chip.

The nvSRAM device 10 includes an SRAM 12 cell that is capable of receiving a bit of data from an exterior environment via bit lines, storing the bit of data, and transmitting the bit of data back to the exterior environment via the bit line at a later time. In an array of nvSRAM cells, a group of eight bits, which is known as a byte of information, is transferred to and from the exterior environment by the bit lines and word lines that enable a particular group of eight nvSRAM cells to transfer a word of information to or from the exterior environment via the bit lines. It should be appreciated that the array can be configured to transfer larger or smaller groups of bits to and from the exterior environment. For example, four bits, which is known as a nibble, can be transferred to and from the exterior environment. As previously mentioned, the SRAM cell 12 requires power to retain a bit of data. If power is removed from the SRAM cell 12, the bit of data retained therein is lost.

The nvSRAM device 10 also includes an nv cell 14 that is capable of receiving a bit of data from the SRAM cell 12 in a store operation, retaining the bit of data even in the absence of power being provided to the nvSRAM device 10, and then transmitting the bit of data back to the SRAM cell 12 in a recall operation.

To provide power to the nvSRAM device 10, a power line 16 is provided for connecting the nvSRAM device 10 to a power supply 18 and a ground line 20 (Vssc) is provided for connecting the nvSRAM device to ground 22.

A controller 24 is included in the nvSRAM device 10 for: (1) providing signals to SRAM cell 12 to transfer a bit of data between the SRAM cell 12 and the exterior environment; (2) providing signals to the SRAM cell 12 and the nv cell 14 to copy a bit of data from the SRAM cell 12 into the nv cell 14, i.e. cause a store operation to be performed; and (3) providing signals to the SRAM cell 12 and the nv cell 14 to copy a bit of data from the nv cell 14 to the SRAM cell 12, i.e. cause a recall operation to be performed. The controller 24 performs the noted operations based upon signals received from a device, typically a microprocessor, that is located exterior to the nvSRAM device 10. For example, if a microprocessor required the bit of data stored in the SRAM 12, it would issue a command to the controller 24. In response, the controller 24 would provide the signals to the SRAM cell 12 to cause the bit of data in the SRAM cell 12 to be transferred to the exterior environment. The controller also performs certain operations without direction from a microprocessor. For instance, the controller 24 is capable of independently sensing when power is being applied to the device 10 and, in response, causing a recall operation to be performed. Conversely, the controller 24 is capable of sensing when power is being removed from the device 10 and, in response, causing a store operation to be performed.

With the foregoing general description of the nvSRAM device 10 in mind, the nvSRAM device 10 is now described in greater detail. Generally the nvSRAM device 10 is comprised of a number of n-channel, Field-Effect Transistors (FETs) and resistors. It should, however, be appreciated that other types of transistors, such as p-channel FETs, bipolar transistors, and combinations of different types of transistors can be utilized.

The SRAM cell 12 includes a first SRAM FET 26A and a second SRAM FET 26B that are in a 1-bit latch configuration in which the drain of each FET is coupled to the gate of the other FET and the source of one FET is coupled to the source of the other FET. In the latch configuration, the first and second SRAM FETs 26A, 26B operate as switches that are either in an ON state an OFF state. More specifically, the latch operates so that when one of the first and second SRAM FETs 26A, 26B is in an ON state the other is necessarily in an OFF state. This manner of operation permits the latch to differentially store a bit of data, which can have either a 0 state or 1 state. For example, if a bit of data is in a 0 state, the latch can represent the 0 state of the bit by placing the first SRAM FET 26A in an ON state and the second SRAM FET 26B in an OFF state. Conversely, if the bit of data is in a 1 state, the latch can represent the 1 state of the bit by placing the first SRAM FET 26A in an OFF state and a second SRAM FET 26B in an ON state.

The SRAM cell 12 further includes first and second pull-up resistors 28A, 28B to aid the first and second SRAM FETs 26A, 26B in latching a bit of data from the nv cell 14 or from the exterior environment. The first pull-up resistor 28A is located between the drain of the first SRAM FET 26A, which is identified as node 30A, and a line that carries a $V_{ccl}$ voltage signal, a voltage signal internal to the chip that is substantially equal to the voltage provided by the external power supply 18. Similarly, the second pull-up resistor 28B is located between node 30B and the line that carries the $V_{ccl}$ voltage signal. There are a number of alternatives to the use of pull-up resistors. For example, depletion n-channel FETs or cross-coupled p-channel FETs can be utilized.

Also included in the SRAM cell 12 are first and second transfer FETs 32A, 32B for transferring a bit of data between the latch formed by the first and second SRAM FETs 26A, 26B and the exterior environment. The gate of each of the first and second transfer FETs 32A, 32B is connected to a word line WL; the drains of the first and second transfer FETs 32A, 32B are respectively connected to nodes 30A, 30B; and the sources of the first and second transfer FETs 32A, 32B are respectively connected to bit lines BLT and BLC. The first and second transfer FETs 32A, 32B finction as switches that are placed in an ON state to transfer a bit of data between the latch and the exterior environment and otherwise placed in an OFF state. The state of the first and second transfer FETs (ON or OFF) is controlled by a signal applied to the word line WL. If the first and second transfer FETs 32A, 32B are in an ON state, a bit of data can be transferred between the latch and the exterior environment via the bit lines BLT and BLC.

The nv cell 14 includes a first silicon nitride oxide semiconductor (SNOS) FET 36A and a second SNOS FET 36B for respectively storing the state of the first SRAM FET 26A and the second SRAM FET 26B. The state of the first and second SRAM FETs 26A, 26B is stored in the first and second SNOS FETs 36A, 36B by forcing, in a store operation, the threshold voltages for turning ON the first and second SNOS FETs 36A, 36B to reflect the states of the first and second SRAM FETs 26A, 26B. For example, if the first SRAM FET 26A is in an OFF state and the second SRAM FET 26B is in an ON state, the store operation would reflect this state of the first and second SRAM FETs 26A, 26B by forcing the threshold voltage for turning ON the first SNOS FET 36A to be more negative than the threshold voltage for turning on the second SNOS FET 36B. It should be appreciated that the SNOS FETs can be replaced with other types of transistors that also have adjustable threshold voltages, such as silicon oxide nitride oxide semiconductor transistors (SONOS), floating gate transistors and ferroelectric transistors.

The nv cell 14 further includes a first store FET 38A and a second store FET 38B that operate as switches during store and recall operations to appropriately configure the nv cell 12 for the transfer of a bit of data between the SRAM cell 12 and the nv cell 14. More specifically, the first and second store FETs 38A, 38B function to connect the nv cell 14 to the SRAM cell 12 during store and recall operations and to otherwise disconnect the nv cell 14 from the SRAM cell 12. The state of the first and second store FETs 38A, 38B is controlled by a $V_{STR}$ signal that is applied to the gates of the FETs. More specifically, if the $V_{STR}$ signal is LOW, the first and second store FETs 38A, 38B are turned OFF to disconnect the nv cell 14 from the SRAM cell 12. Conversely, if the $V_{STR}$ signal is HIGH, the first and second store FETs 38A, 38B are turned ON to connect the nv cell 14 to the SRAM cell 12.

The nv cell 14 further includes a first recall FET 40A and a second recall FET 40B that also functions as switches to place the nv cell 14 in the appropriate configuration for transferring a bit of data between the SRAM cell 12 and the nv cell 14 during store and recall operations. More specifically, the first and second recall FETs 40A, 40B function to connect the nv cell 14 to the power supply 18 during a recall operation and to disconnect the nv cell 14 from the power supply 18 during a store operation and otherwise. The state of the first and second recall FETs 40A, 40B is controlled by a $V_{RCL}$ signal that is applied to the gates of the FETs. More specifically, if the $V_{RCL}$ signal is low, the first and second recall FETs 40A, 40B are turned OFF to disconnect the nv cell 14 from the power supply 18. Conversely, if the $V_{RCL}$ signal is HIGH, the first and second recall FETs 40A, 40B are turned ON to connect the nv cell 14 to the power supply 18.

Figure 2:
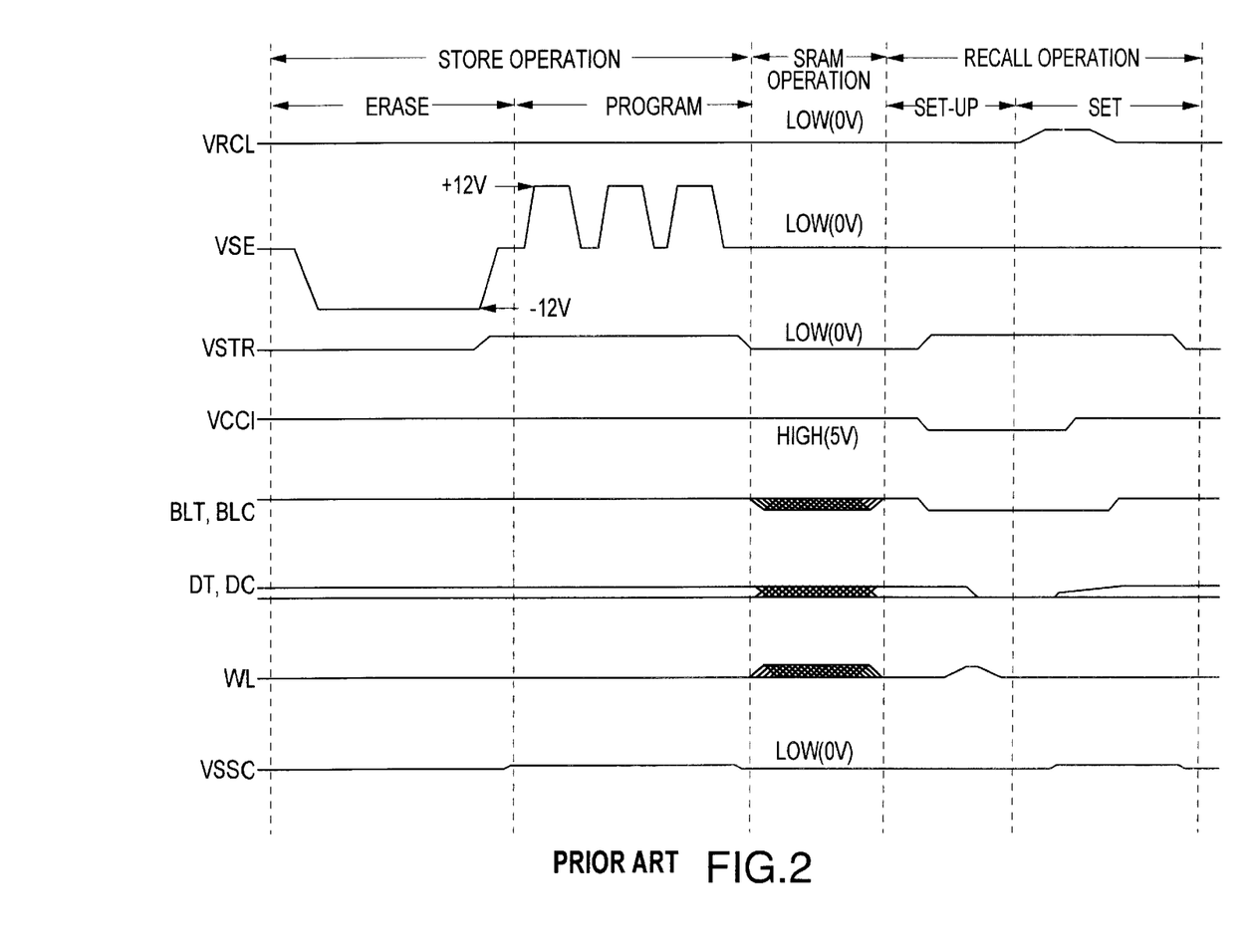
FIG. 2 is a prior art timing diagram of the various signals applied by the controller to the memory cell shown in FIG. 1 during the store and recall operations that transfer a bit of data between the SRAM cell and the nv cell, and during SRAM operations that result in a bit of data being transferred between the SRAM cell and the exterior environment.

With reference to FIG. 2, the prior manner in which the store operation was performed is described so as to give a basis for understanding the manner in which the store operation is conducted to address the store disturb phenomena. The recall operation will also be described with respect to FIG. 2 because of the incorporation of a recall operation into a store operation to provide one type of store disturb immunity. Lastly, the operation of the SRAM cell in transferring a bit of data to/from the exterior environment is described with respect to FIG. 2 for completeness. Subsequently, the manner in which the store operation is conducted to provide store disturb immunity will be discussed.

The prior store operation of the nvSRAM device 10 includes an erase phase and a program phase. During the erase phase, the controller 24 places the first and second SNOS FETs 36A, 36B in a known state so that they can be subsequently programmed to reflect the state of the first and second SRAM FETs 26A, 26B. In the erase phase, the controller 24 initially places: (1) $V_{RCL}$ in a LOW condition to turn OFF the first and second recall FETs 40A, 40B and thereby disconnect the nv cell 14 from the power supply 18; (2) Vstr in a LOW condition to turn OFF the first and second store FETs 38A, 38B and thereby disconnect the nv cell 14 from the SRAM cell 12; (3) Vse at the ground voltage, i.e. 0 volts; (4) Vcci, BLT and BLC in a HIGH condition; and (5) WL and Vssc in a LOW condition. Next, the controller transitions the $V_{SE}$ from ground to a large negative voltage (referred to as an erase voltage) to place the first and second SNOS FETs 36A, 36B in a known condition. Towards the end of the erase phase, the controller 24 raises the Vstr signal from the LOW condition to a HIGH condition to connect the SRAM cell 12 to the nv cell 14. At about the same time, the controller 24 causes the Vse signal to transition from the large negative voltage to ground.

With continued reference to FIG. 2, the program phase commences with the controller 24 connecting the SRAM cell 12 to the nv cell 14 by placing Vstr in a HIGH condition, and disconnecting the nv cell 14 from the power supply 18 by placing Vrcl in a LOW condition. Further, at the beginning of the program phase, the controller 24 establishes Vse at ground. The controller 24 does not change the state of the Vcci, BLT, BLC, WL or Vssc relative to the erase portion. Subsequently, the controller 24 cycles the Vse between ground and a large positive voltage (referred to as a program voltage) to establish different threshold levels in the first and second SNOS FETs 36A, 36B that reflect the state of the first and second SRAM FETs 26A, 26B of the SRAM cell 12. For example, if the first SRAM FET 26A is in an OFF state and the second SRAM FET 26B is in an ON state, the cycling of $V_{SE}$ results in the threshold voltage of the first SNOS FET 36A being set lower than the threshold voltage of the second SNOS FET 36B, thereby reflecting the state of the first and second SRAM FETs 26A, 26B. At the end of the program phase, the controller 24 causes: (1)$V_{SE}$ to transition from 12 volts, the program voltage, to ground; and (2) $V_{STR}$ to transition from the HIGH state to the LOW state to turn OFF the first and second store FETs 38A, 38B, thereby disconnecting the nv cell 14 from the SRAM cell 12.

The recall operation involves a set-up phase in which the SRAM cell 12 is placed in a condition that assures that a bit of data can be transferred from the nv cell 12 to the SRAM cell 12 and a set phase in which the bit of data resident in the nv cell 14 is copied into the SRAM cell 12. At the beginning of the set-up phase, the controller 24 establishes: (1) Vrcl in a LOW condition to disconnect the nv cell 14 from the power supply 18; (2) Vstr in a LOW condition to disconnect the nv cell 14 from the SRAM cell 12; (3) Vse is grounded; (4) WL is in a LOW condition; (5) Vssc in a LOW condition; (6) Vcci in a HIGH condition; and (7) BLT and BLC in a HIGH condition. Subsequently, the controller 24 places Vcci, BLT and BLC in a LOW condition to remove power from the SRAM cell 12 and to isolate the voltages at nodes 30A, 30B. At this point, the controller 24 cycles WL to discharge nodes 30A, 30B and thereby place both of the nodes 30A, 30B in a LOW condition. Thus, the SRAM cell 12 is a known condition that will not interfere with the transfer of a bit of data from the nv cell 14 to the SRAM cell 12. The controller 24 also places Vstr in a HIGH condition during the set-up phase to connect the nv cell 14 to the SRAM cell 12.

At the beginning of the set phase of the recall operation, the controller 24 causes $V_{RCL}$ to transition from a LOW condition to a HIGH condition to turn ON both the first and second recall FETs 40A, 40B and thereby connect the nv cell 14 to the power supply 14. After Vrcl has entered the HIGH condition, the controller 24 causes the $V_{CCI}$ signal to transition from the LOW condition to the HIGH condition thereby applying a voltage to the pull-up resistors 28A, 28B. As a result, the appropriate voltage is established between the gate and drain of one of the first and second SRAM FETs 26A, 26B to be turned ON while the other FET is left turned OFF. Thus, the bit of data that was stored in the nv cell 14 is transferred to the SRAM cell 12. Continuing with the example in which the store operation established a lower threshold voltage for the first SNOS FET 36A relative to the second SNOS FET 36B, the aforementioned sequence of steps for the recall operation produces the appropriate voltage at node 30A to turn ON the second SRAM FET 26B and turn OFF the first SRAM FET 26A thereby copying the bit of data to the SRAM cell that was previously copied from the SRAM to the nv cell.

In transferring a bit of data between the SRAM cell 12 and the exterior environment, the controller 24: (1) place Vrcl, Vse and Vstr in a LOW condition to isolate the nv cell 14 from the power supply 18 and the SRAM cell 12; (2) places Vcci in a HIGH condition to provide power to the SRAM cell 12; and (3) uses BLT, BLC and WL to effect the transfer of a bit of data between the SRAM cell 12 and the exterior environment.

Having now described the prior manner in which an nvSRAM operated, the new store operation is described with respect to preventing or compensating for a store disturb problem associated with the prior store operation that can adversely affect the state of the SRAM cell by causing the cell to "flip," i.e. change from represent a "1" value bit to a "0" value bit or visa versa. Such a flip is undesirable because the initial value of the bit accurately reflects a bit of information, while the flipped bit incorrectly reflects the bit of information. It has been found that store disturb problems occur in defective cells with respect to both the erase and program phases of the store operation described with respect to FIG. 2.

Figure 3:
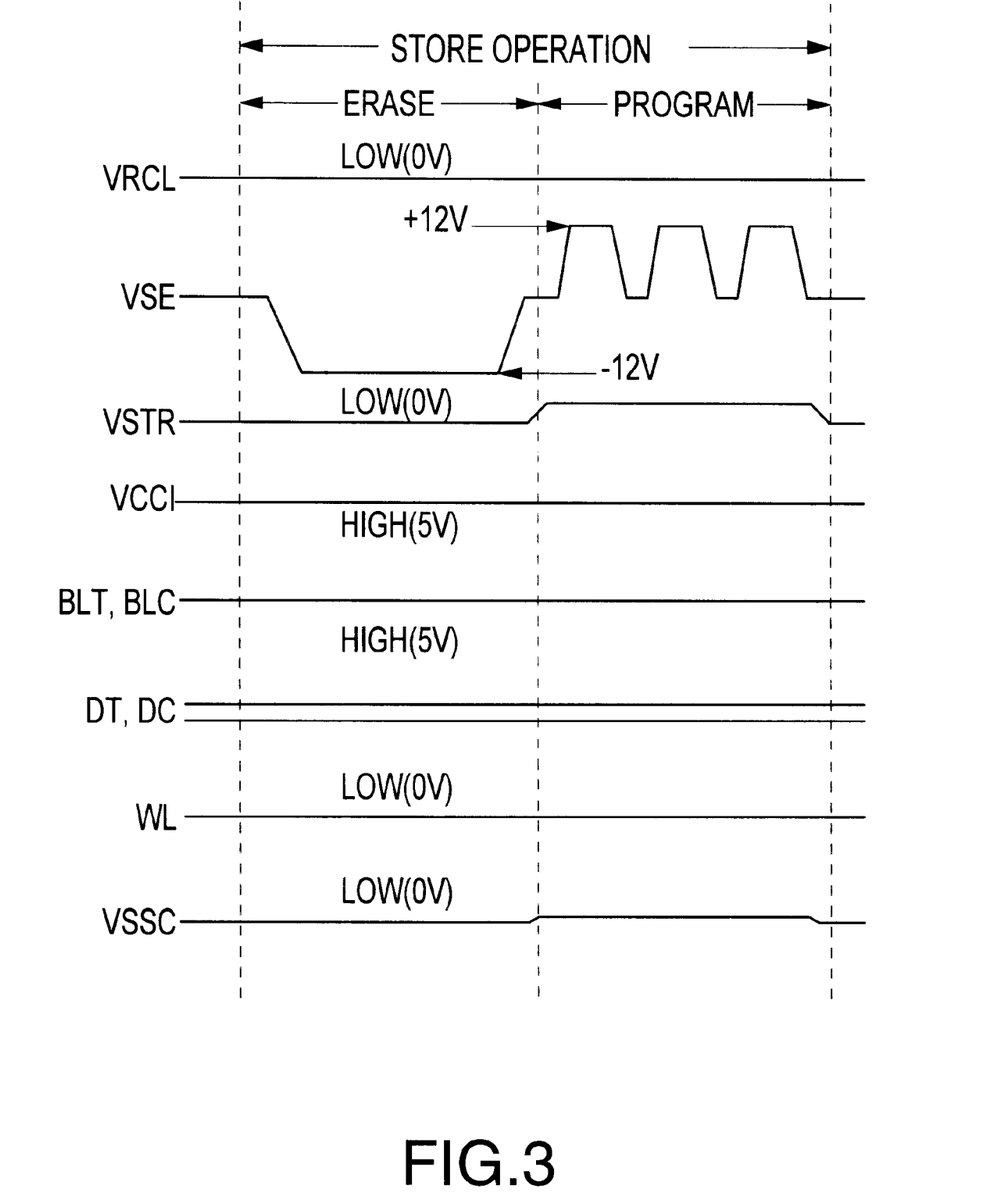
FIG. 3 is a timing diagram of the various signals applied by the controller to the memory cell during the erase portion of a store operation to address a particular type of store disturb that can occur during the erase portion of the store operation.

With respect to store disturbs that occur during the erase phase of the prior store operation, it has been determined that a manufacturing defect causes a gated diode breakdown that, in turn, causes the noted flip to occur. It should be appreciated that the manufacturing defect occurs relatively infrequently, but often enough to produce an undesirable reduction in the yield of the manufacturing process. With reference to FIG. 3, this problem has been addressed by having the controller 24 delay the transitioning of Vstr from the LOW to the HIGH condition relative to the same transition shown in FIG. 2. The controller 24 now delays the noted transition at least until Vse is outside of the gated diode breakdown range, which is between −12 volts and −4 volts. Preferably, the controller 24 causes the Vstr signal to transition from the LOW condition to the HIGH condition after Vse has reached ground. In the illustrated embodiment, the controller 24 causes the Vstr signal to transition at the very end of the erase phase and well after Vse has reached ground.

Figure 4:
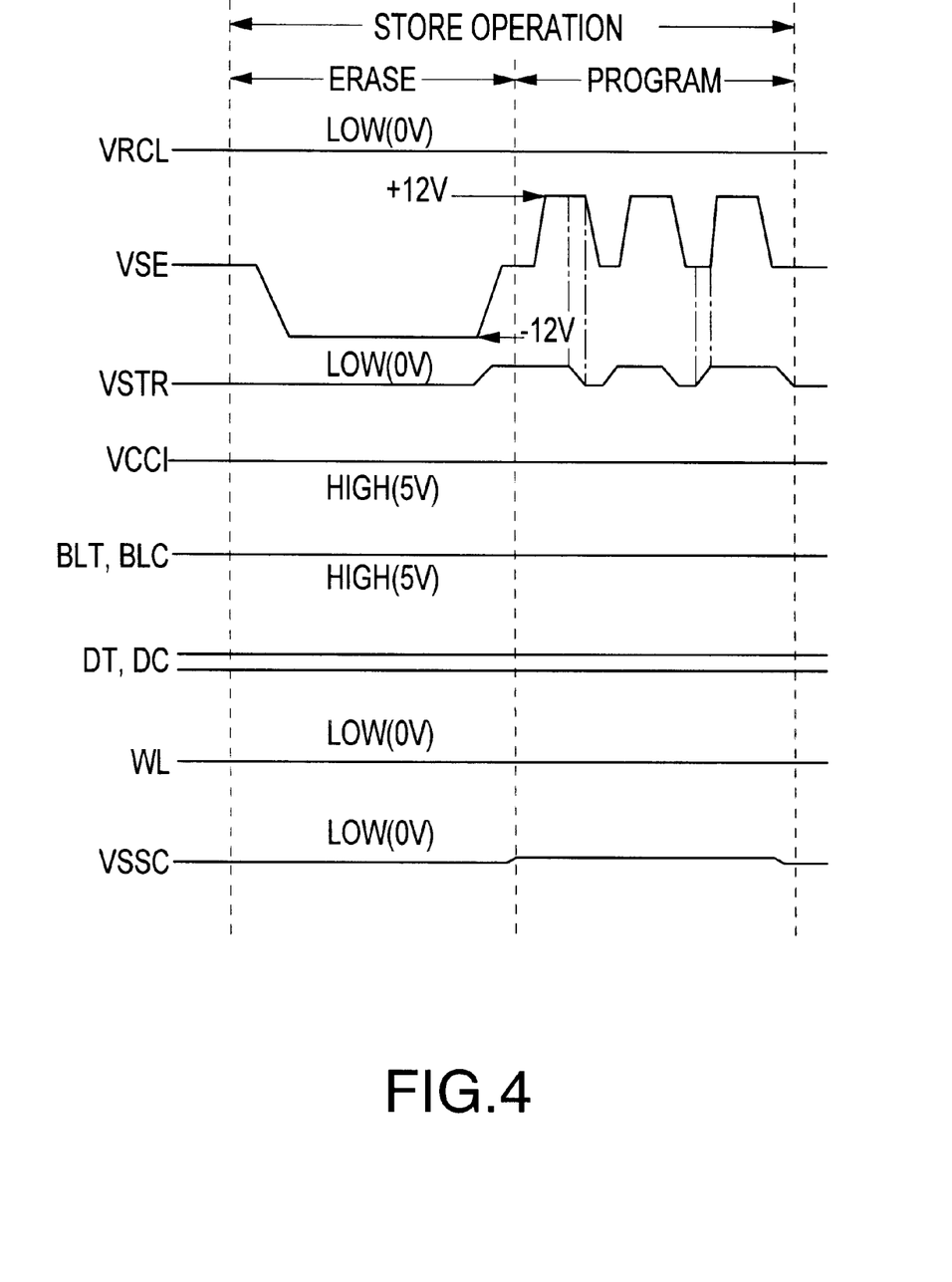
FIG. 4 is a timing diagram of a first set of signals that can be applied by the controller to the memory cell during the program portion of a store operation to address a store disturb that can occur during the program portion of the storage operation.

With respect to store disturbs that occur during the program phase of a store operation and are attributable to crystal defects and/or excessive pull-up impedance, it has been determined that the store disturb is attributable to a coupling between whichever of the nodes 30A, 30B is in a HIGH condition and the nv cell 14 when Vse discharges from the large positive voltage to ground during the cycling of Vse between ground and the large positive voltage. To address this problem, the controller 24 decouples the SRAM cell 12 from the first and second SNOS FETs 36A, 36B. With reference to FIG. 4, this decoupling is accomplished by modulating the Vstr signal between a HIGH condition and a LOW condition. As shown, the controller 24 causes Vstr to commence the transition from the HIGH condition to the LOW condition before Vse is transitioned from the large positive voltage to ground. Moreover, the transition of Vstr to ground is completed before or just about at the time that the controller 24 causes Vse to begin the transition from the large positive voltage to ground. The controller 24 causes Vstr to commence the transition from the LOW condition to the HIGH condition while Vse is at ground. The transition is completed before or just about at the time that the controller 24 causes Vse to begin the transition from ground back to the large positive voltage.

Figure 5:
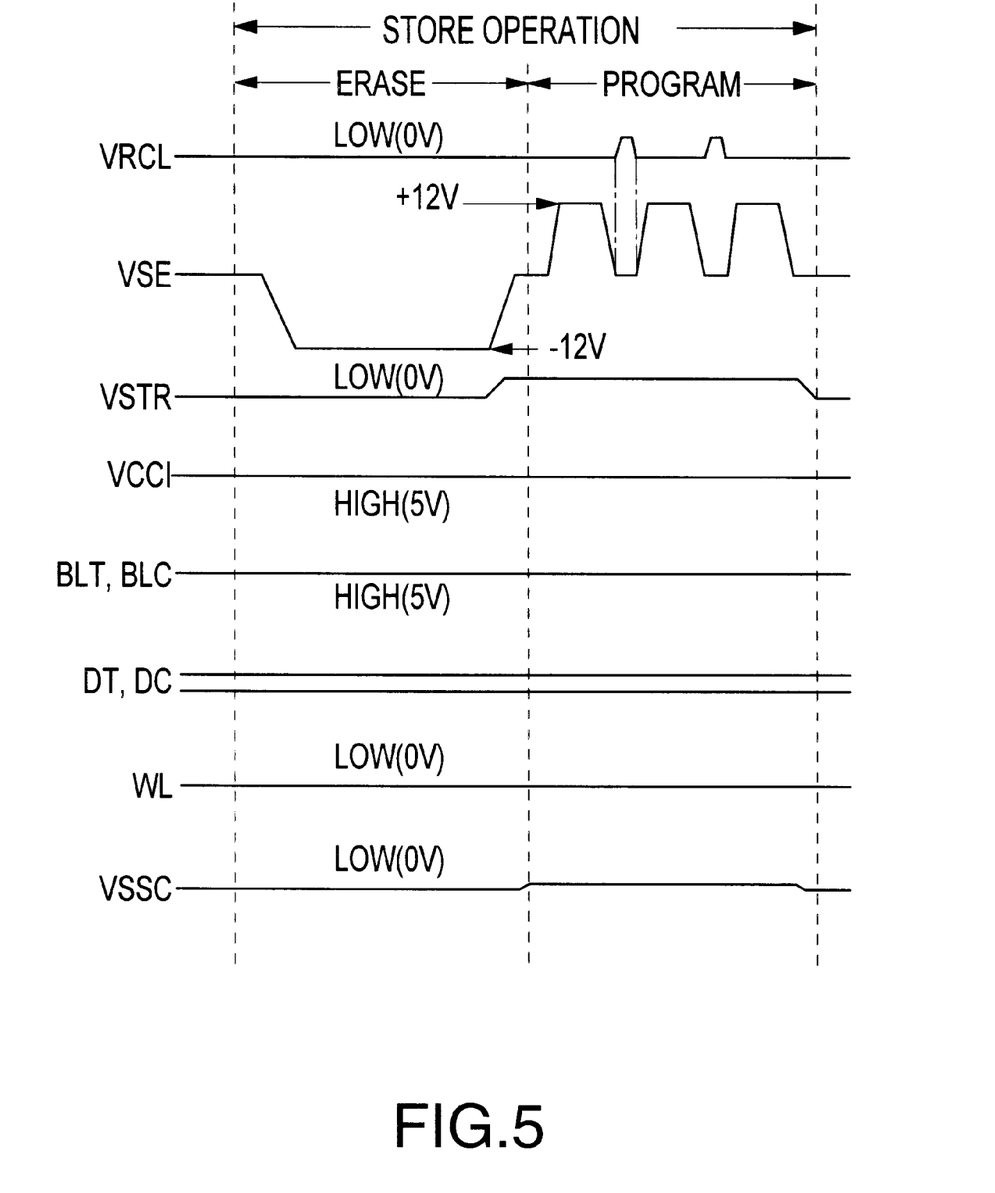
FIG. 5 is a timing diagram of a second set of signals that can be applied by the controller to the memory cell during the program portion of a store operation to address a store disturb that can occur during the program portion of the storage operation.

Another way to address the program phase store disturb involves refreshing the data in the SRAM cell 12 during the program phase of the store operation. By refreshing the data in the SRAM cell 12, any degradation of the data in the SRAM cell 12 that is attributable to the store disturb phenomena is counteracted. With reference to FIG. 5, the controller accomplishes the refresh operation by cycling Vrcl between the LOW and HIGH conditions. To elaborate, during the program phase, the controller 24 places Vstr in a HIGH condition and cycles Vse between a large positive voltage and ground. When both Vrcl and Vstr are in a HIGH condition and Vse is grounded, the power supply 18 can provide charge to the the SRAM cell 12 to refresh the data in the SRAM cell 12. The cycling of Vrcl is 180 degrees out of phase with the cycling of Vse and Vrcl is only in the HIGH condition when Vse is grounded. To elaborate, the controller 24 cycles Vrcl such that the transition from the LOW condition to the HIGH condition commences at about the same time that Vse finishes transitioning from the large positive voltage to ground or shortly thereafter. The transition of the Vrcl from the HIGH condition to the LOW condition is completed before or at about the same time that Vse begins the transition from ground to the large positive voltage.

Figure 6:
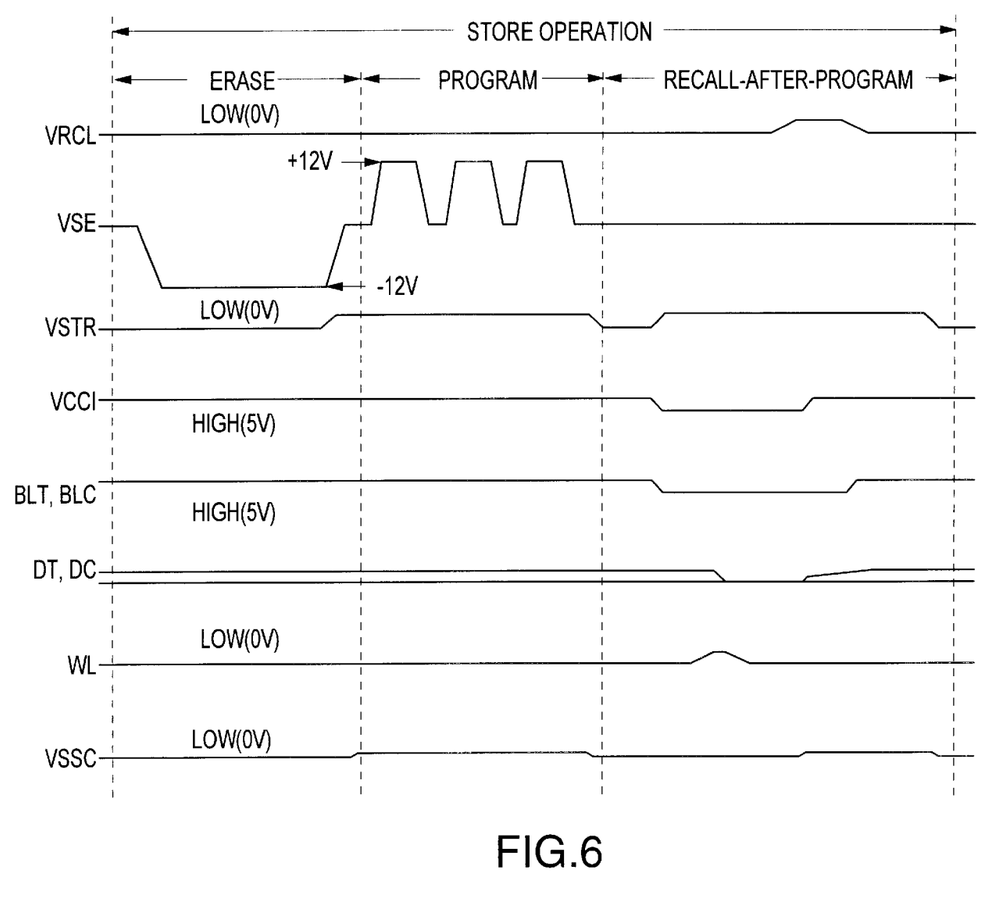
FIG. 6 is a timing diagram of a third set of signals that can be applied by the controller to the memory cell during the program portion of a store operation to address a store disturb that can occur during the program portion of the storage operation.

With reference to FIG. 6, yet a further way to address the program phase store disturb phenomena is accomplished by adding a recall operation to the store operation. The recall phase occurs after the erase and program phases of the store operation, and involves the same signaling by the controller as was noted with respect to the recall operation described with respect to FIG. 1. To differentiate the recall phase from the recall operation, the recall phase is referred to as the recall-after-program phase. The recall-after-program phase refreshes or reestablishes data in the SRAM cell 12 that has been rendered unstable as a result of the discharge of Vse from the large positive voltage to ground during the program phase.

Figure 7:
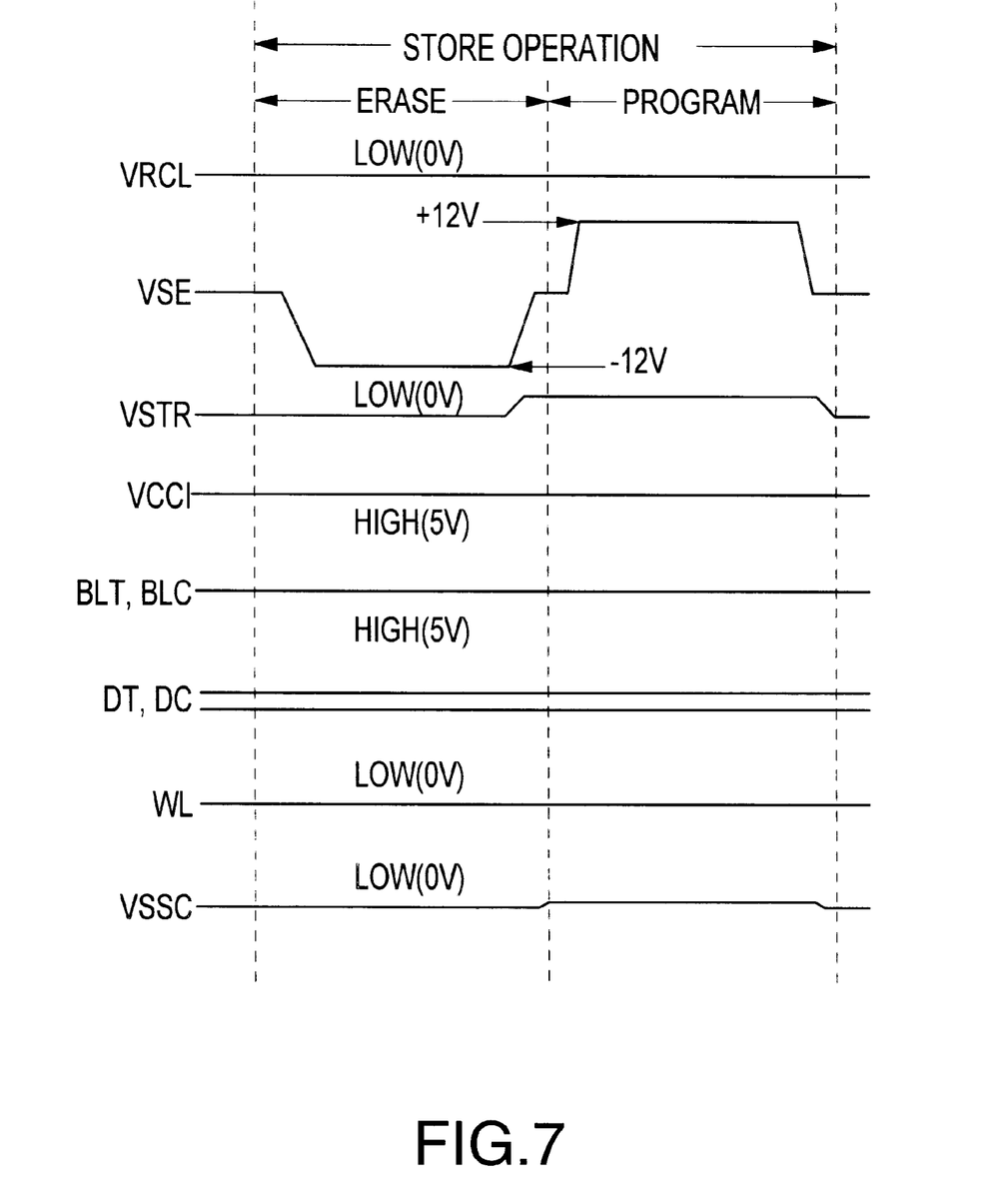
FIG. 7 is a timing diagram of a fourth set of signals that can be applied by the controller to the memory cell during the program portion of a store operation to address a store disturb that can occur during the program portion of the storage operation.

A further way to address the store disturb phenomena that can occur during the program portion is to reduce the number of cycles of Vse. With reference to FIG. 2, Vse was previously cycled between ground and +12 volts eight times during the program phase. For simplicity, FIG. 2 only illustrates three of the cycles of Vse. By cycling Vse a number of times, a leakage current problem that affected the programming of the first and second SNOS FETs 36A, 36B was addressed. It has subsequently been determined that, at least within certain temperature ranges, that the cycling of Vse can be reduced without affecting the programming of the first and second SNOS FETs 36A, 36B. A benefit associated with reducing the number of cycles that Vse undergoes during the program phase is that the store disturb problem associated with the program phase is also addressed. With reference to FIG. 7, Vse is cycled between ground and +12 volts only once during the program phase.

It is possible to implement one or any combination of techniques for addressing the store disturb phenomena. For instance, analysis of the nvSRAM devices being produced by a particular production line could reveal that the only store disturb problem meaningfully impacting yield is an erase phase store disturb. In this case, it would only be necessary to implement the erase phase store disturb immunity technique discussed with respect to FIG. 3. In other cases, it may be necessary to only implement one of the program phase store disturb immunity techniques discussed with respect to FIGS. 4–6. In yet a further case, it may be necessary to implement both the erase phase store disturb immunity technique discussed with respect to FIG. 3 and one or more of the program phase store disturb immunity techniques discussed with respect to FIGS. 4–6.

The foregoing description of the invention has been presented for purposes of illustration and description. Further, the description is not intended to limit the invention to the form disclosed herein. Consequently, variations and modification commensurate with the above teachings, and the skill or knowledge in the relevant art are within the scope of the present invention. The preferred embodiment described hereinabove is further intended to explain the best mode known of practicing the invention and to enable others skilled in the art to utilize the invention required by their particular applications or uses of the invention. It is intended that the appended claims be construed to include alternate embodiments to the extent permitted by the prior art.

What is claimed is:

1. A non-volatile, static random access memory (nvSRAM) with immunity to a store disturb phenomena in which a manufacturing defect can corrupt or render unstable the bit of data resident in the static random access memory (SRAM) portion of the nvSRAM and in some cases, the bit of data resident in the non-volatile (nv) portion of the nvSRAM during the store operation, the non-volatile static random access memory comprising:

a memory cell comprising:
 a static random access memory that is capable of receiving a bit of data from an exterior environment, retaining said bit of data, and transmitting said bit of data to the exterior environment;

wherein a bit of data stored in said static random access memory can be lost if power is removed from said static random access memory;

a non-volatile memory, operatively connected to said static random access memory, that is capable of receiving a bit of data from said static random access memory prior to the possible removal of power from said memory cell, retaining said bit of data even after removal of power from said memory cell, and transmitting said bit of data back to said static random access memory when power is being provided to said memory cell;

wherein the capability of said non-volatile memory to receive a bit of data from said static random access memory is accomplished by store operation;

wherein the capability of said non-volatile memory to transmit a bit of data back to said static random access memory is a recall operation;

an interface for receiving signals relating to the store and recall operations;

a controller for issuing store and recall operation related signals to said interface of said memory cell;

wherein said controller is capable of issuing signals during a store operation to address a store disturb problem.

2. A non-volatile, static random access memory device, as claimed in claim 1, wherein:

said store operation includes an erase portion;

wherein a store disturb can occur during said erase portion;

wherein said controller is capable of issuing signals during said erase portion of said store operation to address a store disturb that can occur during said erase portion.

3. A non-volatile, static random access memory device, as claimed in claim 2, wherein:

said controller is capable of issuing signals during said erase portion to prevent a store disturb that can result from a gated diode breakdown.

4. A non-volatile, static random access memory device, as claimed in claim 1, wherein:

said store operation includes a program portion;

wherein a store disturb can occur during said program portion;

wherein said controller is capable of issuing signals during said program portion of said store operation to address a store disturb that can occur during said program portion.

5. A non-volatile, static random access memory device, as claimed in claim 4, wherein:

said controller is capable of issuing signals during said program portion to disconnect said non-volatile memory from said static random access memory.

6. A non-volatile, static random access memory device, as claimed in claim 4, wherein:

said controller is capable of issuing signals during said program portion to refresh a bit of data in said static random access memory.

7. A non-volatile, static random access memory device, as claimed in claim 4, wherein:

said controller is capable of issuing signals during said program portion to perform a recall operation to refresh a bit of data in said static random access memory.

8. A non-volatile, static random access memory device, as claimed in claim 4, wherein:

said controller is capable of issuing signals immediately after said program portion of said store operation to perform a recall operation to refresh a bit of data in said static random access memory.

9. A method for operating a non-volatile, static random access memory (nvSRAM) to compensate for a store disturb phenomena in which a manufacturing defect can corrupt or render unstable a bit of data resident in the static random access memory portion of the nvSRAM and in some cases, the bit of data resident in the non-volatile portion of the nvSRAM during the store operation, said method comprising the steps of:

providing a memory cell comprising:

a static random access memory that is capable of receiving a bit of data from an exterior environment, retaining said bit of data, and transmitting said bit of data to the exterior environment;

wherein a bit of data resident in said static random access memory can be lost if power is removed from said static random access memory;

a non-volatile memory, operatively connected to said static random access memory, that is capable of receiving a copy of a bit of data from said static random access memory prior to the possible removal of power from said memory cell, retaining said bit of data even after removal of power from said memory cell, and transmitting said bit of data back to said static random access memory when power is being provided to said memory cell;

wherein the capability of said non-volatile memory to receive said bit of data from said static random access memory constitutes a store operation;

wherein the capability of said non-volatile memory to transmit said bit of data back to said static random access memory constitutes a recall operation; and an interface for receiving signals relating to the store and recall operations; and issuing signals to said interface to address a store disturb.

10. A method, as claimed in claim 9, wherein:

said store operation includes an erase portion;

wherein a store disturb can occur during said erase portion;

said interface includes means for receiving $V_{str}$ and $V_{se}$ signals;

said $V_{str}$ signal for connecting and disconnecting said static random access memory and said non-volatile memory;

said $V_{se}$ signal for selectively erasing said non-volatile memory; and said step of issuing includes controlling the states of said $V_{str}$ and $V_{se}$ signals to address a store disturb that can occur during said erase portion.

11. A method, as claimed in claim 10, wherein said step of issuing comprising:

holding $V_{se}$ at a first negative voltage for a first period of time;

permitting Vhd seto transition from said first negative voltage to ground during a second period of time that follows said first period of time; and holding $V_{str}$ at a second negative voltage during at least a portion of said second period of time during which said $V_{se}$ signal is transitioning from said first negative voltage to ground.

12. A method, as claimed in claim 9, wherein:

said store operation includes a program portion;

wherein a store disturb can occur during said program portion;

said interface includes means for receiving a $V_{str}$ and $V_{se}$ signals;

said $V_{str}$ signal for connecting and disconnecting said static random access memory and said non-volatile memory;

said $V_{se}$ signal for selectively erasing said non-volatile memory; and said step of issuing includes controlling the states of $V_{str}$ and $V_{se}$ to address a store disturb that can occur during said program portion.

13. A method, as claimed in claim 12, wherein said step of issuing comprising:

commencing the transition $V_{str}$ from a first positive voltage to ground before beginning the transition of $V_{se}$ from a second positive voltage to ground.

14. A method, as claimed in claim 13, wherein said step of issuing comprising:

completing the transition of $V_{str}$ from a first positive voltage to ground before beginning the transition of $V_{se}$ from a second positive voltage to ground.

15. A method, as claimed in claim 9, wherein:

said store operation includes a program portion;

wherein said store disturb can occur during said program portion;

said interface includes means for receiving $V_{rcl}$ and $V_{se}$ signals;

said $V_{rcl}$ signal for connecting and disconnecting said non-volatile memory and a power supply;

said $V_{se}$ signal for selectively erasing said non-volatile memory;

said step of issuing includes controlling the state of said $V_{rcl}$ and $V_{se}$ signals to address a store disturb that can occur during said program portion.

16. A method, as claimed in claim 15, wherein said step of issuing comprising:

causing said $V_{rcl}$ signal to cycle from ground to a first voltage and from said first voltage to ground during said program portion.

17. A method, as claimed in claim 16, wherein:

said step of causing occurs when $V_{se}$ is at ground.

18. A method, as claimed in claim 9, wherein said step of issuing comprising:

causing a recall operation to occur after said store operation and before any other operation involving said memory cell.

19. A method, as claimed in claim 9, wherein:

said store operation includes a program portion;

wherein said store disturb can occur during said program portion;

said interface includes means for receiving a $V_{se}$ signal;

said $V_{se}$ signal for selectively erasing said non-volatile memory;

said step of issuing includes cycling the $V_{se}$ signal less than eight times during said program portion to address a store disturb that can occur during said program portion.

20. A method, as claimed in claim 19, wherein:

said step of cycling includes cycling $V_{se}$ only once during said program portion.

* * * * *